(12) United States Patent
Korkmaz et al.

(10) Patent No.: US 11,011,521 B2
(45) Date of Patent: May 18, 2021

(54) SEMICONDUCTOR STRUCTURE PATTERNING

(71) Applicant: Micron Technology, Inc., Boise, ID (US)

(72) Inventors: Sevim Korkmaz, Boise, ID (US); Devesh Dadhich Shreeram, Boise, ID (US); Srinivasan Balakrishnan, Meridian, ID (US); Dewali Ray, Boise, ID (US); Sanjeev Sapra, Boise, ID (US); Paul A. Paduano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/423,684

(22) Filed: May 28, 2019

(65) Prior Publication Data

US 2020/0381437 A1 Dec. 3, 2020

(51) Int. Cl.
*H01L 27/108* (2006.01)
*H01L 49/02* (2006.01)

(52) U.S. Cl.
CPC .. *H01L 27/10852* (2013.01); *H01L 27/10814* (2013.01); *H01L 27/10823* (2013.01); *H01L 28/88* (2013.01)

(58) Field of Classification Search
CPC ............... H01L 27/10852; H01L 28/88; H01L 27/10814; H01L 27/10823
See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 10,115,679 B1 * | 10/2018 | Kuo | H01L 23/562 |
| 10,354,859 B1 * | 7/2019 | Kamiya | H01L 21/8229 |
| 2003/0047749 A1 * | 3/2003 | Chaudhry | H01L 21/823487 257/135 |
| 2003/0176056 A1 * | 9/2003 | Lee | H01L 21/76813 438/618 |
| 2006/0046391 A1 * | 3/2006 | Tang | H01L 29/42392 438/268 |
| 2016/0086971 A1 * | 3/2016 | Yeh | H01L 29/40117 438/269 |
| 2016/0343799 A1 * | 11/2016 | Yi | H01L 21/76801 |
| 2017/0025416 A1 * | 1/2017 | Han | H01L 27/10855 |

(Continued)

*Primary Examiner* — Ahmed N Sefer
(74) *Attorney, Agent, or Firm* — Brooks, Cameron & Huebsch, PLLC

(57) ABSTRACT

Methods, apparatuses, and systems related to removing a hard mask are described. An example method includes patterning a silicon hard mask on a semiconductor structure having a first silicate material on a working surface. The method further includes forming a first nitride material on the first silicate material. The method further includes forming a second silicate material on the first nitride material. The method further includes forming a second nitride material on the second silicate material. The method further includes an opening through the semiconductor structure using the patterned hard mask to form a pillar support. The method further includes forming a silicon liner material on the semiconductor structure. The method further includes removing the silicon liner material using a wet etch process.

21 Claims, 11 Drawing Sheets

(56) References Cited

U.S. PATENT DOCUMENTS

2018/0108728 A1\* 4/2018 Yoon ................. H01L 21/31105
2018/0166449 A1\* 6/2018 Pak ................... H01L 27/11293
2018/0182771 A1\* 6/2018 Costa ................. H01L 27/1157
2018/0211962 A1\* 7/2018 Kim ........................ H01L 28/91
2019/0027376 A1\* 1/2019 Yoon .................... H01L 21/304

\* cited by examiner

US 11,011,521 B2

1

SEMICONDUCTOR STRUCTURE PATTERNING

TECHNICAL FIELD

The present disclosure relates generally to semiconductor devices and methods, and more particularly to pattern a semiconductor structure.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
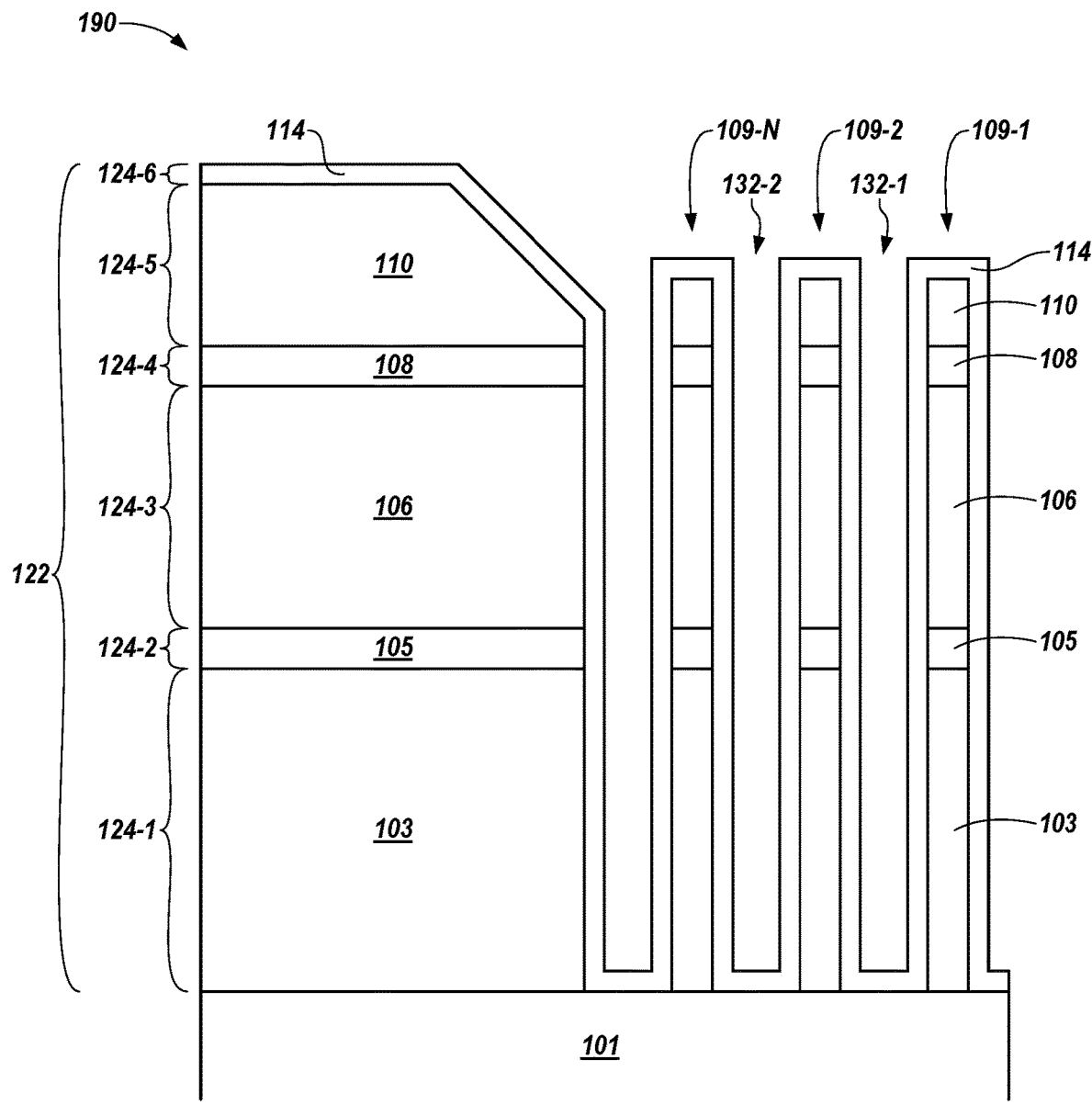
FIGS. 1-6 illustrate cross-sectional views of a portion of a semiconductor structure of a memory device in association with a semiconductor fabrication sequence for patterning a semiconductor structure in accordance with a number of examples of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD),

2 plasma deposition, etc. and patterned using photolithographic techniques, doped and etched using vapor, wet and/or dry etch processes to form semiconductor structures on a working surface. Such openings may contain, or be associated with, various materials that contribute to data access, storage, and/or processing, or to various support structures, on the memory device. As an example, capacitor material may be deposited into these openings to provide the data access, storage, and/or processing.

In order to increase the capacitance of a cell of the memory device, a surface area of a semiconductor working surface formed into a column can be increased by increasing the height of the capacitor material column within the openings. However, as capacitor columns increase in height with pillars having higher aspect ratios, it may increase the thickness of the hard mask material. Subsequent dry etches to straighten the capacitor column and etch away the silicon hard mask material and a silicon liner material within the semiconductor structure may result in a loss of semiconductor support structure pillar materials particularly the nitride lattice.

In order to mitigate this issue, a method for patterning a semiconductor structure is described further below. As an example, a wet etch may be used to remove the silicon. A portion of the hard mask may be left remaining after an initial dry etch. A wet etch may subsequently be performed to remove the hard mask material and a liner material within the semiconductor support structure pillar. During the wet etch, the remaining hard mask material may serve as protection for the semiconductor support structure pillar. Using a wet etch may protect the liner material recess within the semiconductor support structure pillar. Positioning the hard mask material above the semiconductor support structure pillar (e.g. the nitride lattice) during the wet etch may protect the loss of the nitride lattice material.

The present disclosure includes methods, apparatuses, and systems related to patterning a semiconductor structure, resulting in reduced liner loss and reduced semiconductor support structure pillar loss. For example, in a previous approach, a dry etch may remove a portion of the semiconductor support structure pillar. As such, some additional material may be added as a buffer to account for potential semiconductor support structure pillar loss in the etch process.

In one example, accurate nitride material may be formed within the semiconductor support structure pillar without accounting for or providing for potential loss. An example of a method described herein includes patterning a silicon hard mask on a semiconductor structure having a first silicate material on a working surface. The method further includes forming a first nitride material on the first silicate material. The method further includes forming a second silicate material on the first nitride material. The method further includes forming a second nitride material on the second silicate material. The method further includes forming a sacrificial material on the second nitride material. The method further includes an opening through the semiconductor structure using the patterned hard mask to form a semiconductor support structure pillar. The method further includes forming a silicon liner material on the semiconductor structure. The method further includes removing the silicon liner material.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 108 may reference element "08" in FIG. 1, and a similar element may be referenced as 208 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4 in FIG. 1).

FIG. 1 illustrates a cross-sectional view 190 of a portion of a semiconductor structure of a memory device in association with a semiconductor fabrication sequence for patterning a semiconductor structure in accordance with a number of examples of the present disclosure. The example semiconductor support structure can include a plurality of pillars 109-1, 109-2, . . . , 109-N (hereinafter referred to collectively as plurality of pillars 109). Each of the plurality of pillars 109 may include a first silicate material 103, shown to have been formed over an underlying working surface 101. The working surface 101 may be formed from various undoped or doped materials on which memory device materials may be fabricated. Examples of a relatively inert undoped working surface 101 may include monocrystalline silicon (monosilicon), polycrystalline silicon (polysilicon), and amorphous silicon, among other possibilities.

The first silicate material 103 may, in a number of examples, have been formed from borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, and/or formation of the first silicate material 103, as described herein.

The first silicate material 103 may be originally formed (e.g., deposited) over a surface of the underlying working surface 101. For example, the first silicate material 103 may be formed without an opening formed therein from an upper surface of the first silicate material 103 to the surface of the underlying working surface 101. The first silicate material 103 may, in a number of examples, be deposited to a thickness in a range of approximately 200 nanometers (nm) to approximately 600 nm above the surface of the underlying working surface 101. However, embodiments of the present disclosure are not limited to this example.

A first nitride material 105 may be formed over a surface of the first silicate material 103 opposite from the underlying working surface 101. The first nitride material 105 may be formed (e.g., deposited) over an upper surface of the first silicate material 103. The first nitride material 105 may be formed from a nitride material selected for dielectric properties. For example, one or more dielectric nitrides may be selected from silicon nitride ($SiN_X$, $Si_3N_4$), aluminum nitride (AlN), gallium nitride (GN), tantalum nitride (TaN, $Ta_2N$), titanium nitride (TiN, $Ti_2N$), titanium silicon nitride (TiSiN), and tungsten nitride (WN, $W_2N$, $WN_2$), among other possibilities, for formation of the first nitride material 105. The first nitride material 105 may, in a number of examples, be deposited to a thickness in a range of approximately 5 nm to approximately 60 nm above the surface of the first silicate material 103. However, embodiments of the present disclosure are not limited to this example.

A second silicate material 106 is shown to have been formed over a surface of the first nitride material 105 opposite from the first silicate material 103. The second silicate material 106 may, in a number of examples, be formed from tetraethyl orthosilicate ($Si(OC_2H_5)_4$), which is also referred to as TEOS. TEOS may be formed as an ethyl ester of orthosilicic acid ($Si(OH)_4$), among other possibilities. The second silicate material 106 may, in a number of examples, be deposited to a thickness in a range of approximately 250 nm to 450 nm above the surface of the first nitride material 105. However, embodiments of the present disclosure are not limited to this example.

A second nitride material 108 is shown to have been formed over a surface of the second silicate material 106 opposite from the first nitride material 105. The second nitride material 108 may be formed (e.g., deposited) over an upper surface of the second silicate material 106.

Similar to the first nitride material 105, the second nitride material 108 may be formed from a nitride material selected for dielectric properties. For example, the second nitride material 108 may be formed from the same material as the first nitride material 105. The second nitride material 108 may, in a number of examples, be deposited to a thickness in a range of from approximately 20 nm to approximately 100 nm above the surface of the second silicate material 106.

A hard mask material 110 is shown to have been formed over a surface of the second nitride material 108 opposite from the second silicate material 106. The hard mask material 110 may, in a number of examples, be formed from a silicon material and may be referred to as a silicon hard mask material 110. The hard mask material 110 may, in a number of examples, be formed from a polycrystalline silicon (polysilicon), among other possibilities. The hard mask material 110 may, in a number of examples, be deposited to a thickness in a range of approximately 50 nm to 400 nm above the surface of the second nitride material 108. However, embodiments of the present disclosure are not limited to this example. The hard mask material 110 may be patterned and etched, e.g., using a reactive ion etch (RIE) process to form the plurality of pillars 109.

An electrode material 114, e.g., a bottom electrode, may be formed (e.g., deposited) on the sidewalls of the plurality of pillars 109 and on the surface of the working surface 101. The electrode material 114 may be formed (e.g., deposited) from the working surface 101 to a height 122 of the openings 132 at the upper surface of the plurality of pillars 109 through a conformal deposition process such as chemical vapor deposition (CVD). The electrode material 114 may be formed (e.g., deposited) on upper surfaces of the plurality of pillars 109. For example, the inner and upper surfaces of the plurality of pillars 109 may be covered by the electrode material 114.

The electrode material 114 may be formed from a nitride compound material selected for conductive properties. For example, one or more conductive nitrides may be selected from silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities. The electrode material 114 may be formed to various widths (e.g., thicknesses) 124-6 as suited to a particular design rule for the formation of an operable capacitor for a semiconductor device.

In at least one example, the width or diameter respective openings 132-1, 132-2 (hereinafter referred to collectively as openings 132) between plurality of pillars 109-1 and 109-2 may be within a range of approximately 200-600 Angstroms (or 20 to 60 nm) and the height of the openings 132 may be within a range of approximately 8,000-15,000 Angstroms (800-1,500 nm) and may result in an aspect ratio (AR) of the height to width being in a range of approximately 25:1 to approximately 50:1. For clarity in the example fabrication sequence, the figures show a first opening 132-1 and a second opening 132-2 but examples are not limited to two openings and may include various numbers of openings.

As the height 122 of the plurality of pillars 109-1 to 109-N increases, the thickness of the hard mask material 110 may increase as well. Subsequent dry etches to straighten the capacitor column and etch away the hard mask material 110 and subsequently a liner material may result in a loss of pillar materials particularly the second nitride material 108. The plurality of pillars 109 may be formed using a pattern of materials. The plurality of pillars 109 may be formed using a pattern of materials. The plurality of pillars 109 may, in a number of examples, be formed by patterning (e.g., depositing) a first silicate material 103, a first nitride material 105, a second silicate material 106, a second nitride material 108, the hard mask material 110, and the electrode material 114. A support structure formed as such may enable a stack of the first and the second silicate materials 103, 106 to be maintained in a more static configuration relative to each other and the underlying working surface 101 than provided by the first and the second silicate materials 103, 106 themselves.

An etch process (e.g., a first wet etch process or dry etch process) may be utilized to etch into (e.g., through) the hard mask material 110, the second nitride material 108, the second silicate material 106, the first nitride material 105, and/or the first silicate material 103 to form the opening within the previously listed materials (as is illustrated already as opening 132-1 between the plurality of pillars 109-1 and 109-2). Performance of the etch process may allow for a formation of an opening (within which a column of silicon liner material can be deposited) that extends from the upper surface of the hard mask material 110 to the surface of the working surface 101.

The resultant openings 132 may have a height 122 in a range of from approximately 8,000 Angstroms (or 800 nm) to approximately 15,000 Angstroms (or 1,500 nm). Each of the materials may contribute a particular height to the overall height 122 of the structure. As is illustrated in FIG. 1, the first silicate material 103 can have a height 124-1, the first nitride material 105 can have a height 124-2, the second silicate material 106 can have a height 124-3, the second nitride material 108 can have a height 124-4, the hard mask material 110 can have a height 124-5, and the electrode material 114 can have a height/thickness 124-6 that, when added together, results in the overall height 122.

In some examples, the height 124-1 of the first silicate material 103 can be one of approximately 2000 Angstroms, approximately 2400 Angstroms, approximately 3600 Angstroms, approximately 4000 Angstroms, approximately 4200 Angstroms, approximately 4500 Angstroms, approximately 4900 Angstroms, approximately 5300 Angstroms, approximately 5700 Angstroms, and/or within a range from approximately 2000 Angstroms to approximately 6000 Angstroms. In some examples, the height 124-2 of the first nitride material 105 can be one of approximately 50 Angstroms, approximately 100 Angstroms, approximately 400 Angstroms, approximately 550 Angstroms, and/or within a range from approximately 50 to approximately 600 Angstroms. In some examples, the height 124-3 of the second silicate material 108 can be one of approximately 2500 Angstroms, approximately 3500 Angstroms, approximately 4200 Angstroms, and/or within a range from approximately 2500 to 4500 Angstroms. In some examples, the height 124-4 of the second nitride material 108 can be one of approximately 200 Angstroms, approximately 750 Angstroms, approximately 970 Angstroms, and/or within a range from approximately 200 to approximately 1000 Angstroms. However, embodiments of the present disclosure are not limited to this example.

Figure 2:
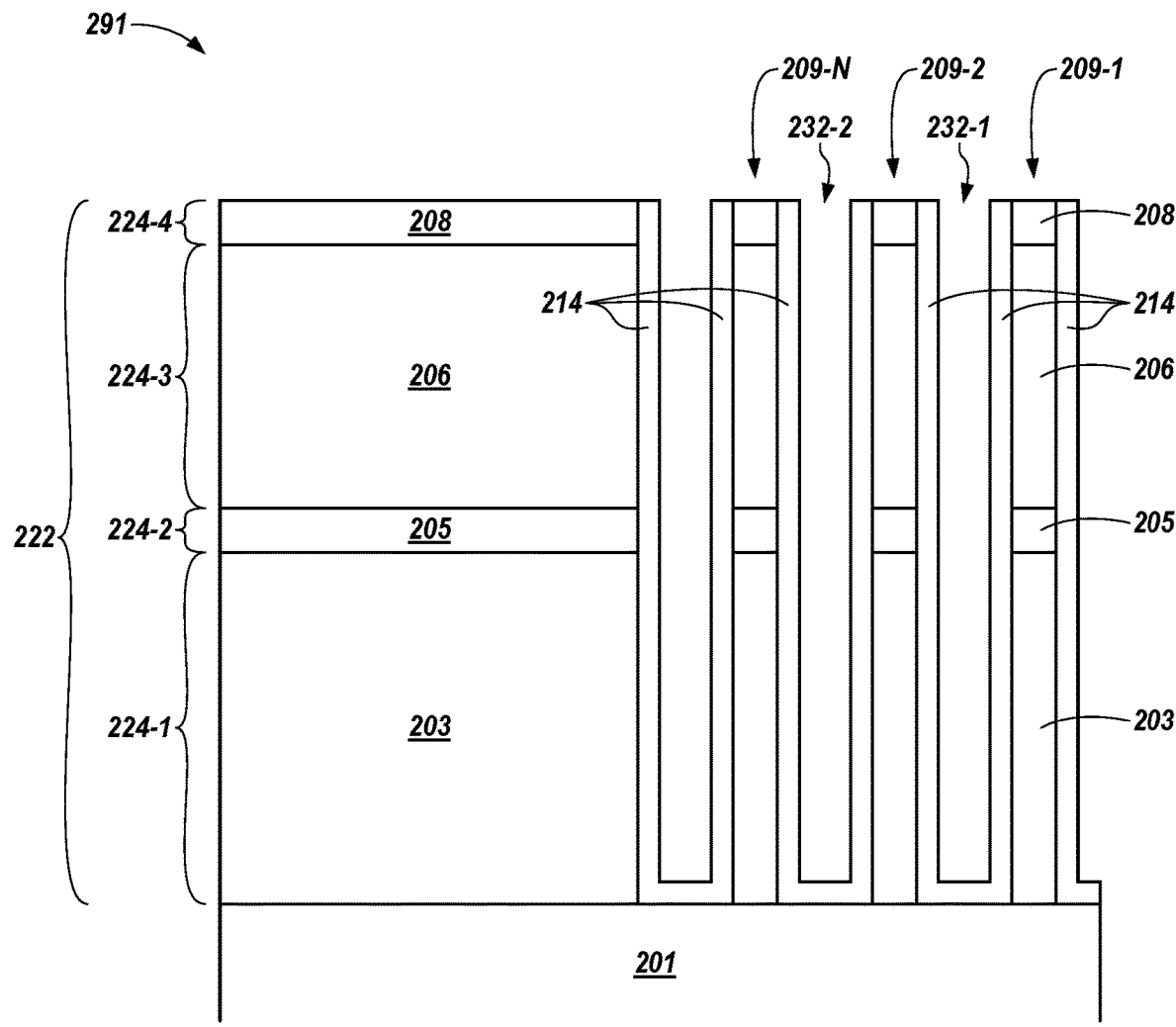

FIG. 2 illustrate cross-sectional views 291 of a portion of a semiconductor structure of a memory device in association with a semiconductor fabrication sequence for patterning a semiconductor structure in accordance with a number of examples of the present disclosure. FIG. 2 illustrates the example semiconductor structure at the particular stage following completion of the example fabrication sequence described in connection with FIG. 1.

The cross-sectional view 291 may include the same or similar elements as the example cross-sectional view 190 as referenced in FIG. 1. For example, the working surface 201 is analogous or similar to working surface 101. First silicate material 203 is analogous or similar to first silicate material 103, first nitride material 205 is analogous or similar to first nitride material 105, second silicate material 206 is analogous or similar to second silicate material 106, second nitride material 208 is analogous or similar to second nitride material 108, and electrode material 214 is analogous or similar to electrode material 114.

As illustrated in FIG. 2, the hard mask material (110 as illustrated in FIG. 1) has been removed from the portion of the example memory device shown in FIG. 1. As the height 222 of the plurality of pillars 209 increases, the thickness of the hard mask material may increase. Subsequent dry etches may be used to straighten the capacitor column and etch away the electrode material 214 and the hard mask material. The hard mask material may be removed by (via application of) dry etch.

The dry etch may be a mixture of a selective solvent may be selected from water (H2O), methanol (CH3OH), ethanol (C2H5OH), isomers of propanol (C3H7OH) such as n-propanol and isopropanol, n-butanol (C4H9OH), among other possible alcohols, and sulfuric acid (H2SO4), Hydrofluoric acid (HF), Phosphoric Acid (H3PO4), Hydrochloric Acid (HCl), Ammonium Hydroxide (NH4OH), and combinations thereof, among other possibilities. The dry etch may be used to etch away the hard mask material on top of the second nitride material 208. The dry etch may be used to etch away the entirety of the hard mask material. For example, the dry etch may remove approximately 50 nm to 400 nm of the hard mask material above the surface of the second nitride material 208. The removal of the hard mask material leaves the second nitride material 208 exposed at the top of the plurality of the pillars 209.

Figure 3A:
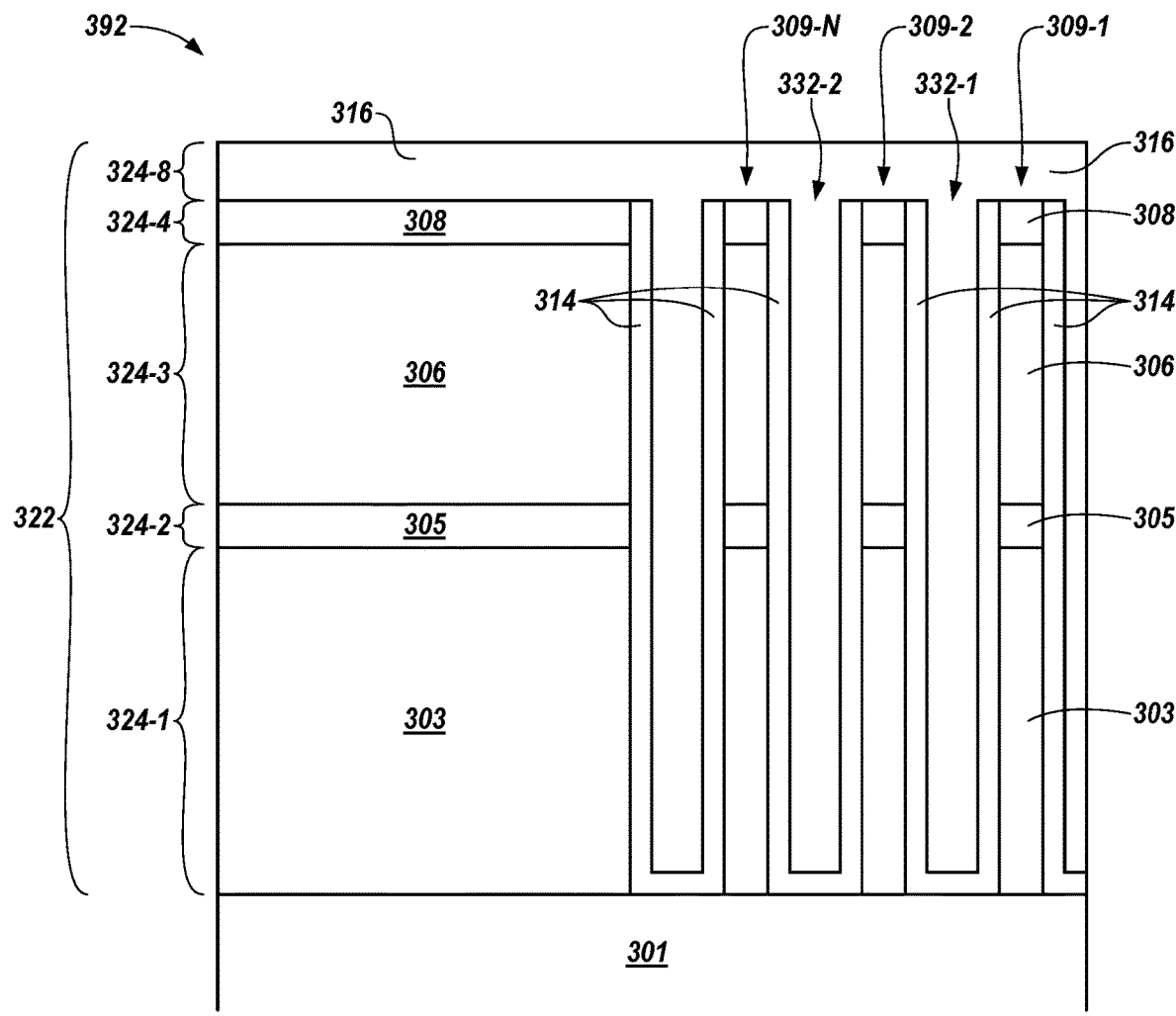

FIG. 3A illustrates a cross-sectional view 392 of a portion of semiconductor structure of a memory device in association with a semiconductor fabrication sequence for patterning a semiconductor structure in accordance with a number of examples of the present disclosure. FIG. 3 illustrates the example semiconductor structure at a particular stage following completion of the example fabrication sequence described in connection with FIG. 2.

The cross-sectional view 392 can include the same or similar elements as the example cross-sectional views 190 and 291 as referenced in FIGS. 1 and 2, respectively. For example, the working surface 301 is analogous or similar to working surface 101 and 201 of FIGS. 1 and 2, respectively. The first silicate material 303 is analogous or similar to first silicate material 103 and 203 of FIGS. 1 and 2, respectively. The first nitride material 305 is analogous or similar to first nitride material 105 and 205 of FIGS. 1 and 2, respectively. The second silicate material 306 is analogous or similar to second silicate material 106 and 206 of FIGS. 1 and 2, respectively. The second nitride material 308 is analogous or similar to second nitride material 108 and 208 of FIGS. 1 and 2, respectively. The electrode material 314 is analogous or similar to electrode material 114 and 214 of FIGS. 1 and 2, respectively.

In one example, a liner material 316 may be deposited within the openings 332 to create more stability within the semiconductor structure. The liner material 316 may fill the openings 332 such that it is be deposited on the upper surfaces of the plurality of pillars 309. The liner material 316 may fill the openings 332 from the surface of the working surface to a height 322 of the openings 332 at the upper surface of the plurality of pillars 309. The liner material 316 may, in a number of examples, be formed from a silicon material and may be referred to as a silicon liner material 316. The liner material 316 may, in a number of examples, be formed from monocrystalline silicon (monosilicon), polycrystalline silicon (polysilicon), and amorphous silicon, among other possibilities.

Following the etching of the hard mask material (110, as illustrated in FIG. 1), the liner material 316 may be deposited on the exposed second nitride material 308. The liner material 316 may, in a number of examples, be deposited to a thickness in a range of approximately 50 nm to 500 nm above the surface of the second nitride material 108. The resultant structure may have a height 322 in a range of from approximately 8,000 Angstroms (or 800 nm) to approximately 15,000 Angstroms (or 1,500 nm). Each of the materials may contribute a particular height to the overall height 322 of the structure. As is illustrated in FIG. 3, the first silicate material 303 can have a height 324-1, the first nitride material 305 can have a height 324-2, the second silicate material 306 can have a height 324-3, the second nitride material 308 can have a height 324-4, and the liner material 316 can have a height 324-8 that, when added together, results in the overall height 322.

Figure 3B:
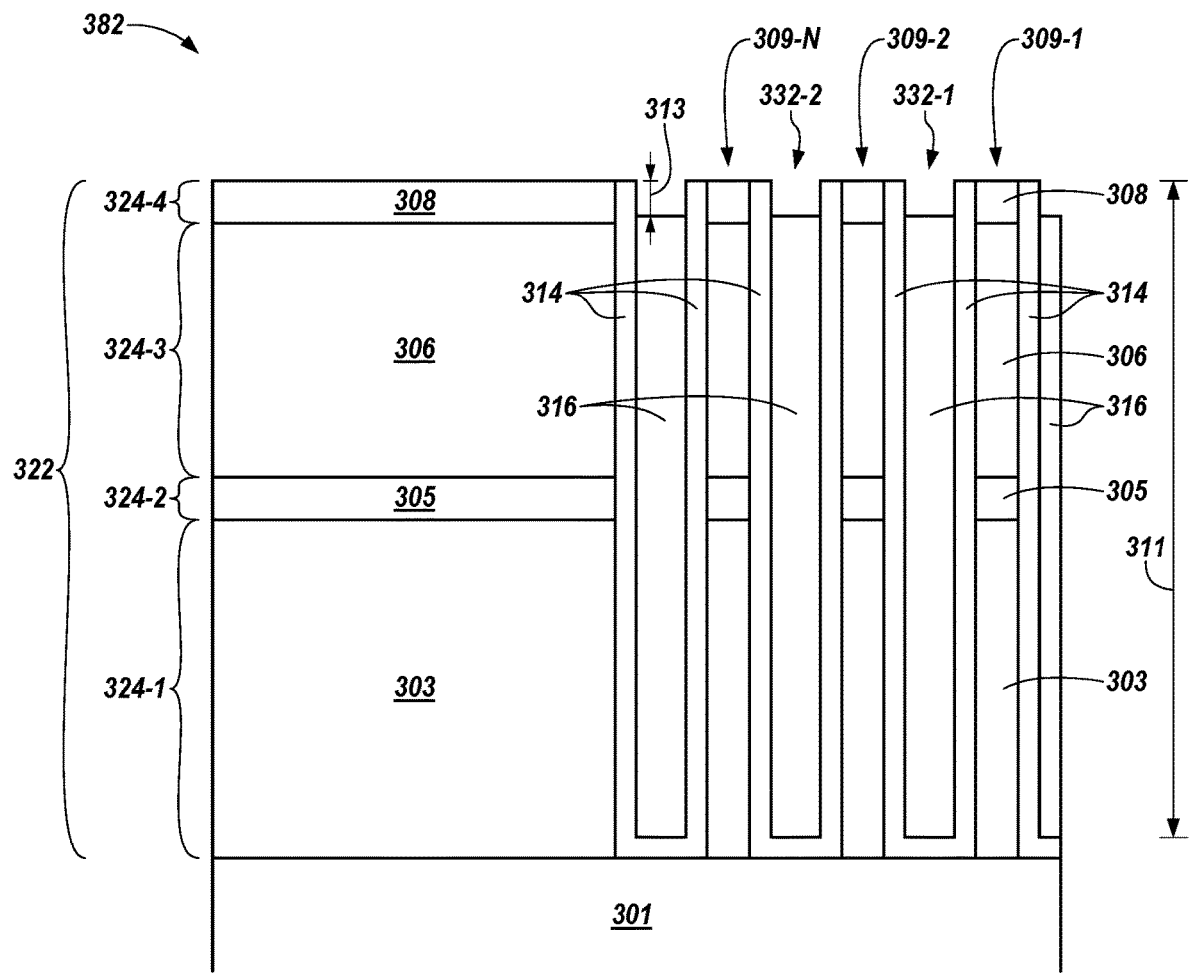

FIG. 3B illustrates a cross-sectional view 382 of a portion of semiconductor structure of a memory device in association with a semiconductor fabrication sequence for patterning a semiconductor structure in accordance with a number of examples of the present disclosure. FIG. 3 illustrates the example semiconductor structure at a particular stage following completion of the example fabrication sequence described in connection with FIG. 3A.

The cross-sectional view 382 can include the same or similar elements as the example cross-sectional views 190, 291, and 392 as referenced in FIGS. 1, 2, and 3A, respectively. For example, the working surface 301 is analogous or similar to working surface 101 and 201 of FIGS. 1 and 2, respectively. The first silicate material 303 is analogous or similar to first silicate material 103 and 203 of FIGS. 1 and 2, respectively. The first nitride material 305 is analogous or similar to first nitride material 105 and 205 of FIGS. 1 and 2, respectively. The second silicate material 306 is analogous or similar to second silicate material 106 and 206 of FIGS. 1 and 2, respectively. The second nitride material 308 is analogous or similar to second nitride material 108 and 208 of FIGS. 1 and 2, respectively. The electrode material 314 is analogous or similar to electrode material 114 and 214 of FIGS. 1 and 2, respectively. The liner material 316 is analogous or similar to liner material 316 of FIG. 3A.

As illustrated in FIG. 3B, the top of the liner material 316 has been removed from the portion of the example semiconductor structure shown in FIG. 3A. The top of the liner material 316 may be removed by (via application of) wet etch. The removal of the top of the liner material 316 leaves the second nitride material 308 exposed at the top of the plurality of the pillars 309.

The wet etch may be a solvent formed from ammonium, and combinations thereof, among other possibilities. The wet etch may be used to etch away the top of the liner material 316. The liner material 316 may be deposited within the openings 332 to create more stability within the semiconductor structure. After the wet etch to remove the top of the liner material 316, the liner material 316 may fill the openings 332 from the surface of the working surface to a height near the surface of the second nitride material 308.

An etch of the top of the liner material 616 may cause a recess of the liner material 316 to a depth (D) 313 between the walls of the electrode 614. The liner material 316 may recess below the second nitride material 308 to a less extent using the wet etch process, described herein, as it is removed. This result can be advantageous as a recess may cause less stability to the pillars 309 in subsequent processing steps and allow for shorts, or other defects, within a resulting semiconductor structure. Advantageously, in some example embodiments according to particular design rules and/or aspect ratios (A/R) of greater than 25:1, using a wet etch may cause the liner material 316 to recess by a range of 2 nm to 20 nm. As such, using a wet etch may lessen the liner material 316 recess by a range of 10% to 20% over using a dry etch process.

Figure 4:
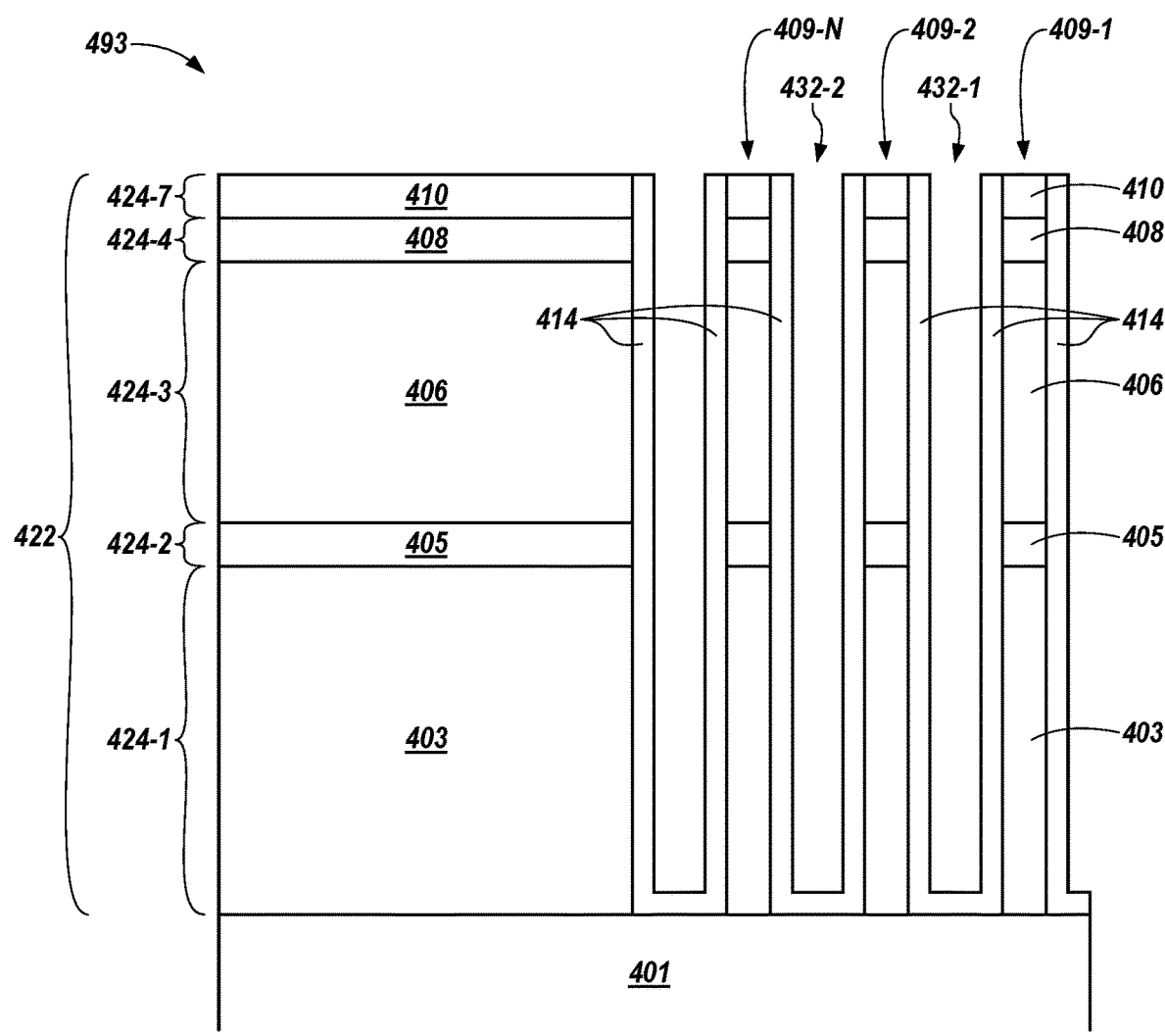

FIG. 4 illustrates a cross-sectional view 493 of a portion of semiconductor structure of a memory device in association with a semiconductor fabrication sequence for patterning a semiconductor structure in accordance with a number of examples of the present disclosure. FIG. 4 illustrates the example semiconductor structure following completion of the example fabrication sequence described in connection with FIG. 1.

The cross-sectional view 493 can include the same or similar elements as the example cross-sectional views 190, 291, 392, and 382 as referenced in FIGS. 1, 2, 3A, and 3B respectively. For example, the working surface 401 is analogous or similar to working surface 101, 201, and 301 of FIGS. 1, 2, 3A, and 3B respectively. The first silicate material 403 is analogous or similar to first silicate material 103, 203, and 303 of FIGS. 1, 2, 3A, and 3B respectively. The first nitride material 405 is analogous or similar to first nitride material 105, 205, and 305 of FIGS. 1, 2, 3A, and 3B respectively. The second silicate material 406 is analogous or similar to first silicate material 106, 206, and 306 of FIGS. 1, 2, 3A, and 3B respectively. The second nitride material 408 is analogous or similar to second nitride material 108, 208, and 308 of FIGS. 1, 2, 3A, and 3B respectively. The electrode material 414 is analogous or similar to electrode material 114, 214, and 314 of FIGS. 1, 2, 3A, and 3B respectively. The hard mask material 410 is analogous or similar to hard mask material 110 of FIG. 1.

As illustrated in FIG. 4, a portion of the hard mask material 410 has been removed from the portion of the example memory device shown in FIG. 1 using a controlled dry etch. As the height 422 of the plurality of pillars 409 increases, the thickness of the hard mask material 410 may increase. Subsequent dry etches may be used to straighten the capacitor column and etch away the hard mask material 410. As such, the hard mask material 410 may be removed by (via application of) dry etch.

The dry etch may be a mixture of a selective solvent may be selected from water (H2O), methanol (CH3OH), ethanol (C2H5OH), isomers of propanol (C3H7OH) such as n-propanol and isopropanol, n-butanol (C4H9OH), among other possible alcohols, and sulfuric acid (H2SO4), Hydrofluoric acid (HF), Phosphoric Acid (H3PO4), Hydrochloric Acid (HCl), Ammonium Hydroxide (NH4OH), and combinations thereof, among other possibilities.

In this example embodiment, the controlled dry etch may be used to etch away a portion of the hard mask material, but leave a remaining portion of the hard mask material 410 as a buffer. In some embodiments, the dry etch may be used to etch away approximately 60% of the hard mask material (110 as illustrated in FIG. 1) above the second nitride material 408. In one example, up to approximately 40% of an original thickness of the hard mask material 410 may be remaining after the controlled dry etch removal process in order to protect the second nitride material 408 from removal in subsequent processing steps. In this example, the height (124-5 in FIG. 1) of hard mask material 410 may be reduced to the height 424-7.

In previous approaches, the second nitride material 408 may be a thicker height than described in connection with the present application because of the inclusion of a sacrificial portion of the second nitride material 408. Also, in previous approaches, a dry etch is used to etch away a liner material (316 as illustrated in FIG. 3). And, as a result, the sacrificial portion of the second nitride would be used because the dry etch will attack and remove a portion of the second nitride material 408.

It is possible that as a wet etch is used in the present description and in the description of FIGS. 1-3B, the wet etch, too, may remove a portion of a liner material filled in the openings 432-1 and 432-2 and that the wet etch without the remaining hard mask material 410 serving as a buffer the wet may also etch away a portion of the second nitride material 208 shown in FIG. 2.

However, in the present example embodiment, having the remaining hard mask material 410 as protection for the second nitride material 408 means a thinner nitride material may be used. During the wet etch process, the wet etch may remove the remaining hard mask material 410 and not, or to a lesser degree, the second nitride material 408. As such, according to this example embodiment, a sacrificial portion may no longer be needed for the second nitride material 408 because the second nitride material 408 is protected by the remaining hard mask material 410. In some embodiments, a thinner second nitride material 408 may produce a capacitance gain between 0.1 to 2%, or 0.1 to 0.5 femto Farads (fF) in capacitance in certain design rules. For example, more of a second silicate material 406 may be deposited to a greater height for taller pillars 409 within an acceptable stability and an overall greater height to a storage node structure may be realized. With more height, a resultant surface area for a capacitor structure may be increased allowing for a greater storage capacitance value. This is described further next in connection with FIGS. 5 and 6 to the present embodiment.

Figure 5:
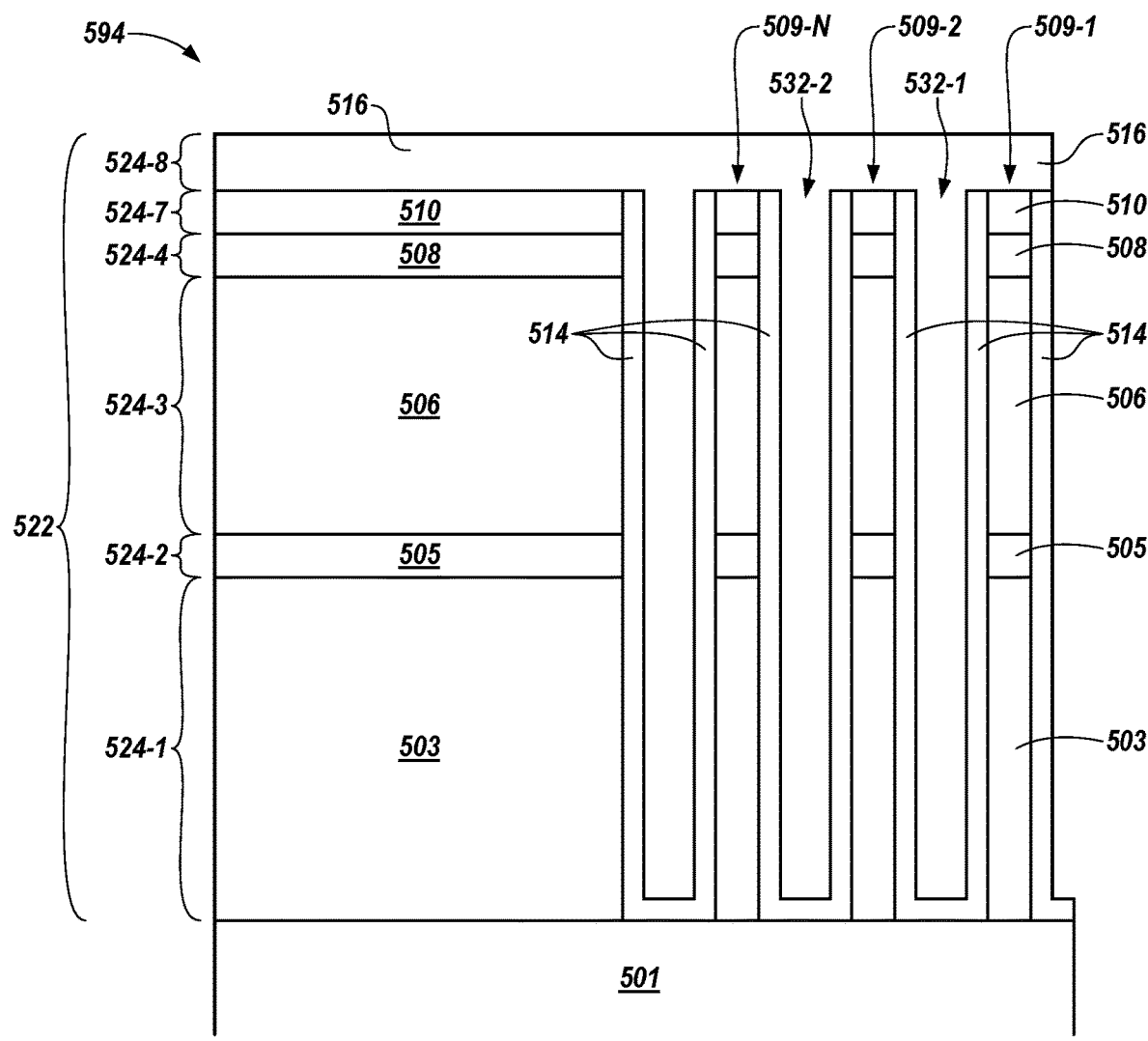

FIG. 5 illustrates a cross-sectional view 594 of a portion of semiconductor structure of a memory device in association with a semiconductor fabrication sequence for patterning a semiconductor structure in accordance with a number of examples of the present disclosure. FIG. 5 illustrates the example semiconductor structure following completion of the example fabrication sequence described in connection with FIG. 4.

The cross-sectional view 594 can include the same or similar elements as the example cross-sectional views 190, 291, 392, 382, and 493 as referenced in FIGS. 1, 2, 3A, 3B, and 4 respectively. For example, the working surface 501 is analogous or similar to working surface 101, 201, 301, and 401 of FIGS. 1, 2, 3, and 4 respectively. The first silicate material 503 is analogous or similar to first silicate material 103, 203, 303, and 403 of FIGS. 1, 2, 3, and 4 respectively. The first nitride material 505 is analogous or similar to first nitride material 105, 205, 305, and 405 of FIGS. 1, 2, 3, and 4 respectively. The second silicate material 506 is analogous or similar to first silicate material 106, 206, 306, and 406 of FIGS. 1, 2, 3, and 4, respectively. The second nitride material 508 is analogous or similar to second nitride material 108, 208, 308, and 408 of FIGS. 1, 2, 3, and 4 respectively. The electrode material 514 is analogous or similar to electrode material 114, 214, 314 and 414 of FIGS. 1, 2, 3, and 4, respectively. The hard mask material 510 is analogous or similar to hard mask material 110 and 410 of FIGS. 1 and 4 respectively.

In one example, a liner material 516 may be deposited within the openings 532 to create more stability within the semiconductor structure. The liner material 516 may fill the openings 532 such that it is be deposited on the upper surfaces of the plurality of pillars 509. The liner material 516 may fill the openings 532 from the surface of the working surface 501 to a height 522 of the openings 532 at the upper surface of the plurality of pillars 509.

Following the etching away of a portion of the hard mask material 510, the liner material 516 may be deposited on the remaining portion of the hard mask material 510, opposite the second nitride material 508. The liner material 516 may, in a number of examples, be deposited to a thickness in a range of approximately 50 nm to 500 nm above the surface of the remaining portion of the hard mask material 510.

The resultant semiconductor structure may have a height 522 in a range of from approximately 8,000 Angstroms (or 800 nm) to approximately 15,000 Angstroms (or 1,500 nm). Each of the materials may contribute a particular height to the overall height 522 of the structure. As is illustrated in FIG. 5, the first silicate material 503 can have a height 524-1, the first nitride material 505 can have a height 524-2, the second silicate material 506 can have a height 524-3, the second nitride material 508 can have a height 524-4, the remaining portion of the hard mask material 510 can have a height 524-7, and the liner material 516 can have a height 524-8 that, when added together, results in the overall height 522.

Figure 6:
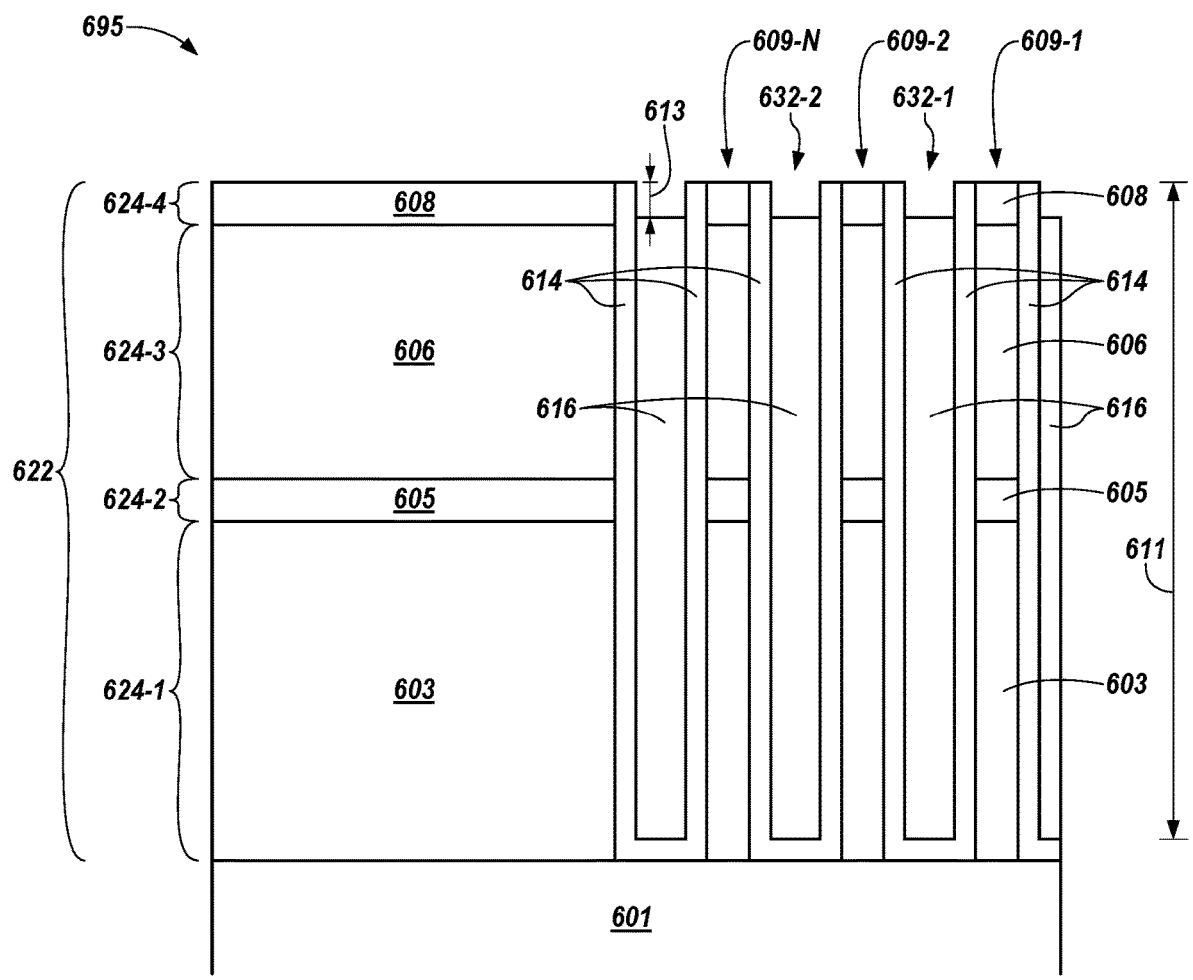

FIG. 6 illustrates a cross-sectional view 695 of a portion of semiconductor structure of a memory device in association with a semiconductor fabrication sequence for patterning a semiconductor structure in accordance with a number of examples of the present disclosure. FIG. 6 illustrates the example semiconductor structure at the particular stage following completion of the example fabrication sequence described in connection with FIG. 5.

The cross-sectional view 695 can include the same or similar elements as the example cross-sectional views 190, 291, 392, 382, 493, and 594 as referenced in FIGS. 1, 2, 3A, 3B, 4, and 5 respectively. For example, the working surface 601 is analogous or similar to working surface 101, 201, 301, 401, and 501 of FIGS. 1, 2, 3, 4, and 5 respectively. The first silicate material 603 is analogous or similar to first silicate material 103 and 203 of FIGS. 1 and 2 respectively. The first nitride material 605 is analogous or similar to first nitride material 105, 205, 305, 405, and 505 of FIGS. 1, 2, 3, 4, and 5 respectively. The second silicate material 606 is analogous or similar to second silicate material 106, 206, 306, 406, and 506 of FIGS. 1, 2, 3, 4, and 5 respectively. The second nitride material 608 is analogous or similar to second nitride material 108, 208, 308, 408, and 508 of FIGS. 1, 2, 3, 4, and 5 respectively. The electrode material 614 is analogous or similar to electrode material 114, 214, 314, 414, and 514 of FIGS. 1, 2, 3, 4, and 5 respectively.

As illustrated in FIG. 6, the remaining portion of the hard mask material and the top of the liner material 616 have been removed from the portion of the example semiconductor structure shown in FIG. 5. The remaining portion of the hard mask material and the top of the liner material 616 may be removed by (via application of) wet etch. The removal of the remaining portion of the hard mask material leaves the second nitride material 608 exposed at the top of the plurality of the pillars 609 and maintains an intended height (H) 622 to walls of the electrodes 614, e.g., bottom electrodes.

The wet etch may be a solvent formed from ammonium, and combinations thereof, among other possibilities. The wet etch may be used to etch away the top of the liner material 616 and the hard mask material. The second nitride material 608 may be protected from the wet etch by the hard mask material. The liner material 616 may be deposited within the openings 632 to create more stability within the semiconductor structure. After the wet etch to remove the top of the liner material 616, the liner material 616 may fill the openings 632 from the surface of the working surface to a height near the surface of the second nitride material 608.

An etch of the top of the liner material 616 and the hard mask material may cause a recess of the liner material 616 to a depth (D) 613 between the walls of the electrode 614. The liner material 616 may recess below the second nitride material 608 to a less extent using the wet etch process, described herein, and/or due to the buffer of the remaining hard mask material (510 from FIG. 5) as it is removed. This result can be advantageous as a recess may cause less stability to the pillars 609 in subsequent processing steps and allow for shorts, or other defects, within a resulting semiconductor structure. Advantageously, in some example embodiments according to particular design rules and/or aspect ratios (A/R) of greater than 25:1, using a wet etch may cause the liner material 616 to recess by a range of 2 nm to 20 nm. As such, using a wet etch may lessen the liner material 616 recess by a range of 10% to 20% over using a dry etch process and/or not maintaining the buffer of the remaining hard mask material (510 in FIG. 5).

Figure 7:
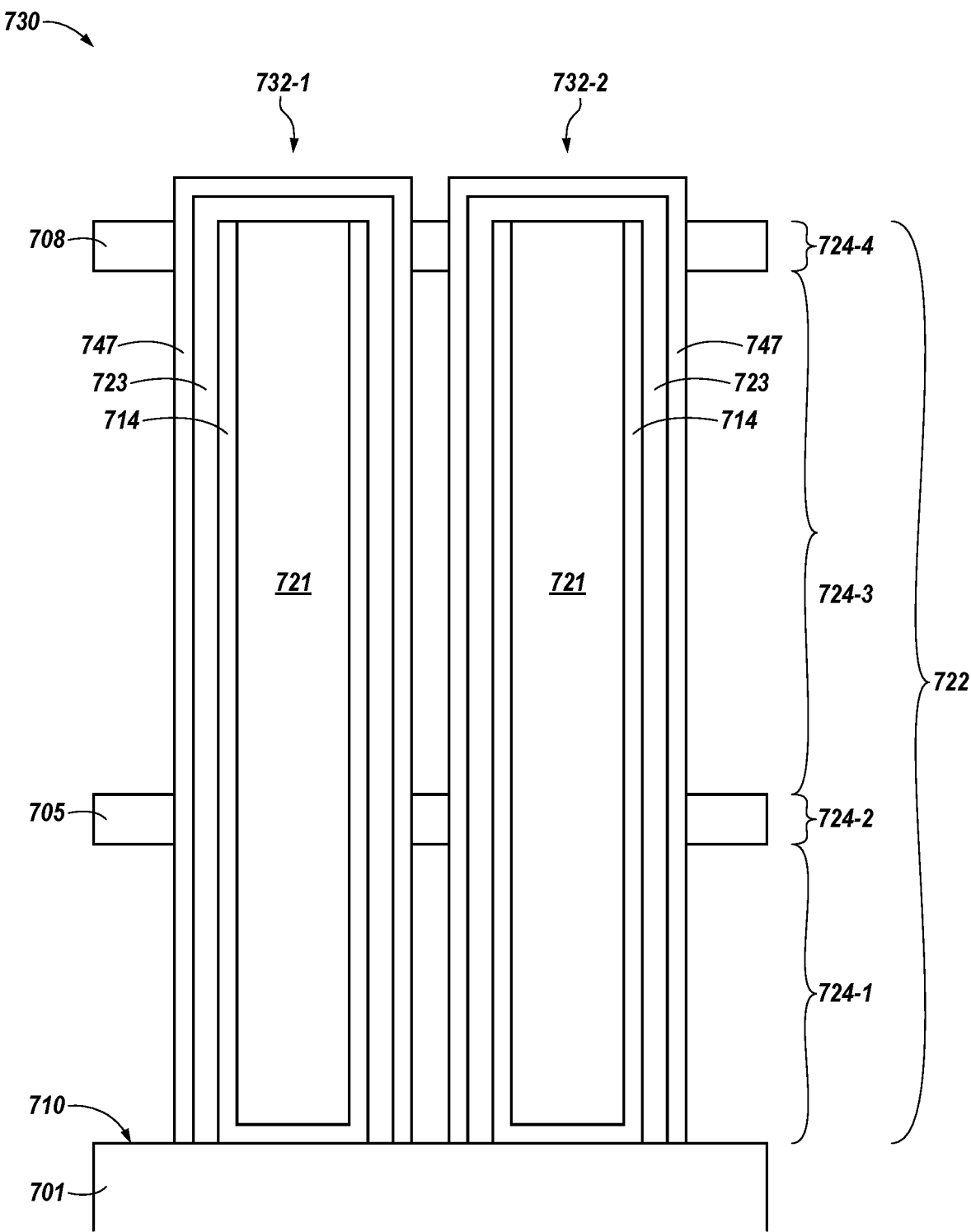
FIG. 7 illustrates a cross-sectional view of a portion of an example semiconductor structure of a memory device in association with a semiconductor fabrication sequence for patterning a semiconductor structure in accordance with a number of examples of the present disclosure

FIG. 7 illustrates a cross-sectional view 730 of a portion of an example semiconductor structure of a memory device in association with a semiconductor fabrication sequence for patterning a semiconductor structure in accordance with a number of examples of the present disclosure. FIG. 7 illustrates the example semiconductor structure following completion of the example fabrication sequence described in connection with FIG. 6.

The cross-sectional view 730 can include the same or similar elements as the example cross-sectional views 190, 291, 392, 493, and 594 as referenced in FIGS. 1, 2, 3, 4, 5, and 6 respectively. For example, the working surface 701 is analogous or similar to working surface 101, 201, 301, 401, 501, and 601 of FIGS. 1, 2, 3, 4, 5, and 6 respectively. The first nitride material 705 is analogous or similar to first nitride material 105, 205, 305, 405, 505, and 605 of FIGS. 1, 2, 3, 4, 5, and 6 respectively. The second nitride material 708 is analogous or similar to second nitride material 108, 208, 308, 408, 508, and 608 of FIGS. 1, 2, 3, 4, 5, and 6 respectively. The electrode material 714 is analogous or similar to electrode material 114, 214, 314, 414, 514, and 614 of FIGS. 1, 2, 3, 4, 5, and 6 respectively.

Using the techniques and method embodiments described herein has allowed maintaining a height (H) 722 to achieve greater surface area to the storage node structure, e.g., capacitor cell, permitting an increase in the capacitance of the one (1) to five (5) percent (1-5%) according to a particular design rule. As shown, the dielectric material 723 has been formed (e.g., deposited) on an outer surface of the electrode material 714. The dielectric material 723 may, in a number of examples, be formed from a surface of the working surface 701 to cover the outer surface, including an upper surface, of the electrode material 714. A capacitor may be subsequently formed, at least in part, by formation (e.g., deposition) of a top electrode material 747 on an outer surface of the dielectric material 723.

As is illustrated in FIG. 7, a height 722 of the semiconductor support structure can include a height 724-2 and 724-4 of the first nitride material 705 and the second nitride material 708 along with heights 724-1, and 724-3 of the removed first silicate material, and the second silicate material.

A height 722 of the capacitor may be higher than the height of the original opening (H 622) due to the maintained height of the second nitride material 708 and resultantly the electrode material 714, the added height of the dielectric material 723, and the top electrode material 747, being formed over the electrode material 714. The dielectric material 723 and the top electrode material 547 may be formed from various respective dielectric materials, conductive materials, and resistive materials and to various width (e.g., thickness) usable in association with formation of an operable silicon fill material 721 for a semiconductor device.

The support structure is formed from the first nitride material 705 and the second nitride material 708, in addition to the underlying working surface 701. The support structure may provide support to the silicon fill material 721 after the removal of the first and second silicate materials has left voids in the semiconductor structure and even after such voids may have been at least partially filled by a buffer material. The support structure formed from the first and second nitride materials 705, 708 is shown for ease of illustration in what can be a 3D-cross sectional view to be supporting behind the silicon fill material 721 and the right side of the electrode material 714. However, the support structure formed from the first and second nitride materials 705, 708 also may be on the opposite sides, or may be attached at four position or even surround, the silicon fill material 721. In a number of examples, the dielectric material 723 and/or the top electrode material 747 may surround the electrode material 714 except at defined positions where the first and second nitride materials 705, 708 of the support structures are attached to the electrode material 714.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. By including a sacrificial storage node, as described herein, the width for openings 732 may be widened, increasing the space for the capacitor to be filled. The capacitor may be filled into the openings 732, leaving space for another capacitor material to be filled without the two capacitor materials touching. For example, the widening of the openings 732.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

Figure 8:
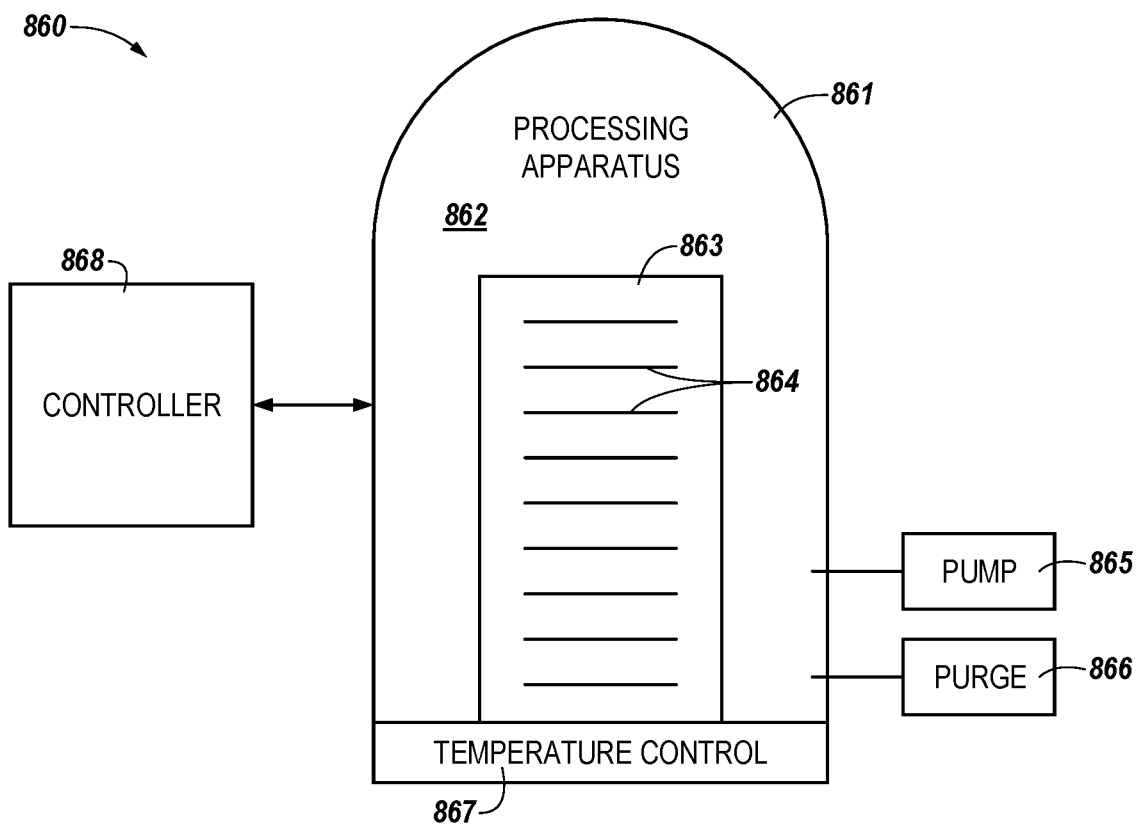
FIG. 8 is a functional block diagram of a system for implementation of an example semiconductor fabrication process in accordance with a number of embodiments of the present disclosure.

FIG. 8 is a functional block diagram of a system 860 for implementation of an example semiconductor fabrication process in accordance with a number of embodiments of the present disclosure. The system 860 can include a processing apparatus 861. The processing apparatus 861 can be configured to enable patterning a semiconductor structure.

The processing apparatus 861 can include a semiconductor processing chamber 862 to enclose components configured to pattern a semiconductor structure. The chamber 862 can further enclose a carrier 863 to hold a batch of semiconductor wafers 864 (e.g., the working surface 101). The processing apparatus 861 can include and/or be associated with tools including, for example, a pump 865 unit and a purge 866 unit configured to introduce and remove reactants. In one example, the reactants may include precursors/reducing agents. The processing apparatus 861 can further include a temperature control 867 unit configured to maintain the chamber 862 at appropriate temperatures as described herein.

The system 860 can further include a controller 868. The controller 868 can include, or be associated with, circuitry and/or programming for implementation of, for instance, depositing a storage node material. Adjustment of such deposition and purging operations by the controller 868 can control the thickness of the materials described herein (the first silicate material, the first nitride material, the first silicate material, and the second nitride material).

The controller 868 can, in a number of embodiments, be configured to use hardware as control circuitry. Such control circuitry may, for example, be an application specific integrated circuit (ASIC) with logic to control fabrication steps, via associated deposition and purge processes, for patterning a semiconductor structure.

Figure 9:
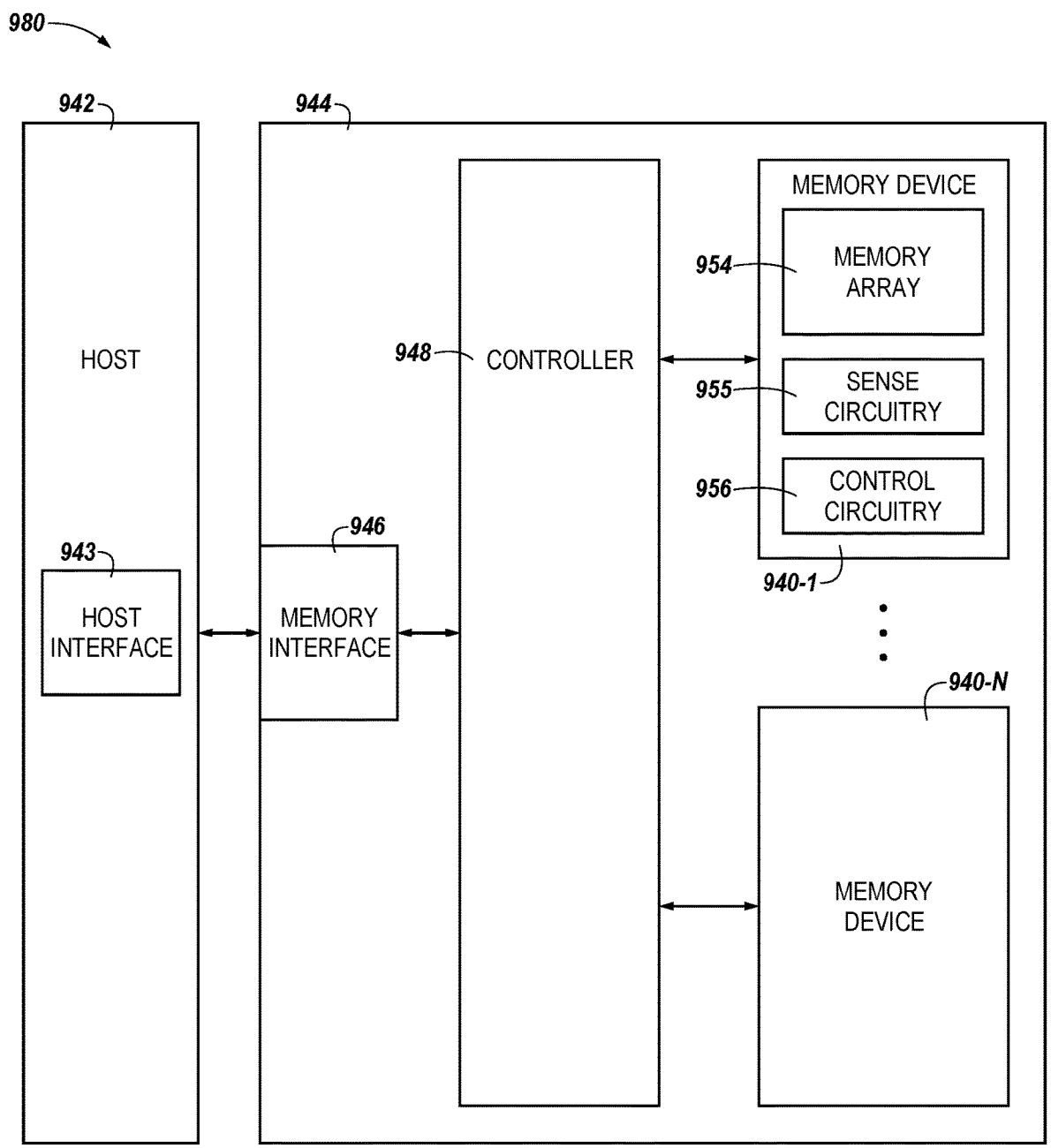
FIG. 9 illustrates a functional block diagram of an example computing system including a semiconductor structure of a memory system in accordance with a number of examples of the present disclosure.

FIG. 9 is a functional block diagram of a computing system 980 including at least an example of semiconductor structure of a memory system 944 in accordance with one or more examples of the present disclosure. Memory system 944 may be, for example, a solid-state drive (SSD).

In the example illustrated in FIG. 9, memory system 944 includes a memory interface 946, a number of memory devices 940-1, . . . , 940-N, and a controller 948 selectably coupled to the memory interface 946 and memory devices 940-1, . . . , 940-N. Memory interface 946 may be used to communicate information between memory system 944 and another device, such as a host 942. Host 942 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. Such a host may be associated with fabrication operations performed on semiconductor devices and/or SSDs using, for example, a processing.

In a number of examples, host 942 may be associated with (e.g., include or be coupled to) a host interface 943. The host interface 943 may enable input of scaled preferences (e.g., in numerically and/or structurally defined gradients) to define, for example, critical dimensions (CDs) of a final structure or intermediary structures of a memory device (e.g., as shown at 940) and/or an array of memory cells (e.g., as shown at 954) formed thereon to be implemented by the processing apparatus. The scaled preferences may be provided to the host interface 943 via input of a number of preferences stored by the host 942, input of preferences from another storage system (not shown), and/or input of preferences by a user (e.g., a human operator).

Memory interface 946 may be in the form of a standardized physical interface. For example, when memory system 944 is used for information (e.g., data) storage in computing system 980, memory interface 946 may be a serial advanced technology attachment (SATA) interface, a peripheral component interconnect express (PCIe) interface, or a universal serial bus (USB) interface, among other physical connectors and/or interfaces. In general, however, memory interface may provide an interface for passing control, address, information, scaled preferences, and/or other signals between the controller 948 of memory system 944 and a host 942 (e.g., via host interface 943).

Controller 948 may include, for example, firmware and/or control circuitry (e.g., hardware). Controller 948 may be operably coupled to and/or included on the same physical device (e.g., a die) as one or more of the memory devices 940-1, . . . , 940-N. For example, controller 948 may be, or may include, an ASIC as hardware operably coupled to circuitry (e.g., a printed circuit board) including memory interface 946 and memory devices 940-1, . . . , 940-N. Alternatively, controller 948 may be included on a separate physical device that is communicatively coupled to the physical device (e.g., the die) that includes one or more of the memory devices 940-1, . . . , 940-N.

Controller 948 may communicate with memory devices 940-1, . . . , 940-N to direct operations to sense (e.g., read), program (e.g., write), and/or erase information, among other functions and/or operations for management of memory cells. Controller 948 may have circuitry that may include a number of integrated circuits and/or discrete components. In a number of examples, the circuitry in controller 948 may include control circuitry for controlling access across memory devices 940-1, . . . , 940-N and/or circuitry for providing a translation layer between host 942 and memory system 944.

Memory devices 940-1, . . . , 940-N may include, for example, a number of memory arrays 954 (e.g., arrays of volatile and/or non-volatile memory cells). For instance, memory devices 940-1, . . . , 940-N may include arrays of memory cells, such as a portion of an example memory device 990 structured to form structures formed according to embodiments described in FIGS. 1-7, described in connection with FIG. 9. As will be appreciated, the memory cells in the memory arrays 954 of memory devices 940-1, . . . , 940-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 940 may be formed on the same die. A memory device (e.g., memory device 940-1) may include one or more arrays 954 of memory cells formed on the die. A memory device may include sense circuitry 955 and control circuitry 956 associated with one or more arrays 954 formed on the die, or portions thereof. The sense circuitry 955 may be utilized to determine (sense) a particular data value (e.g., 0 or 1) that is stored at a particular memory cell in a row of an array 954. The control circuitry 956 may be utilized to direct the sense circuitry 955 to sense particular data values, in addition to directing storage, erasure, etc., of data values in response to a command from host 942 and/or host interface 943. The command may be sent directly to the control circuitry 956 via the memory interface 946 or to the control circuitry 956 via the controller 948.

The example illustrated in FIG. 9 may include additional circuitry that is not illustrated so as not to obscure examples of the present disclosure. For example, memory devices 940 may include address circuitry to latch address signals provided over I/O connectors through I/O circuitry. Address signals may be received and decoded by a row decoder and a column decoder to access a memory array 954. It will be appreciated that the number of address input connectors may depend on the density and/or architecture of memory devices 940 and/or memory arrays 954.

Figure 10:
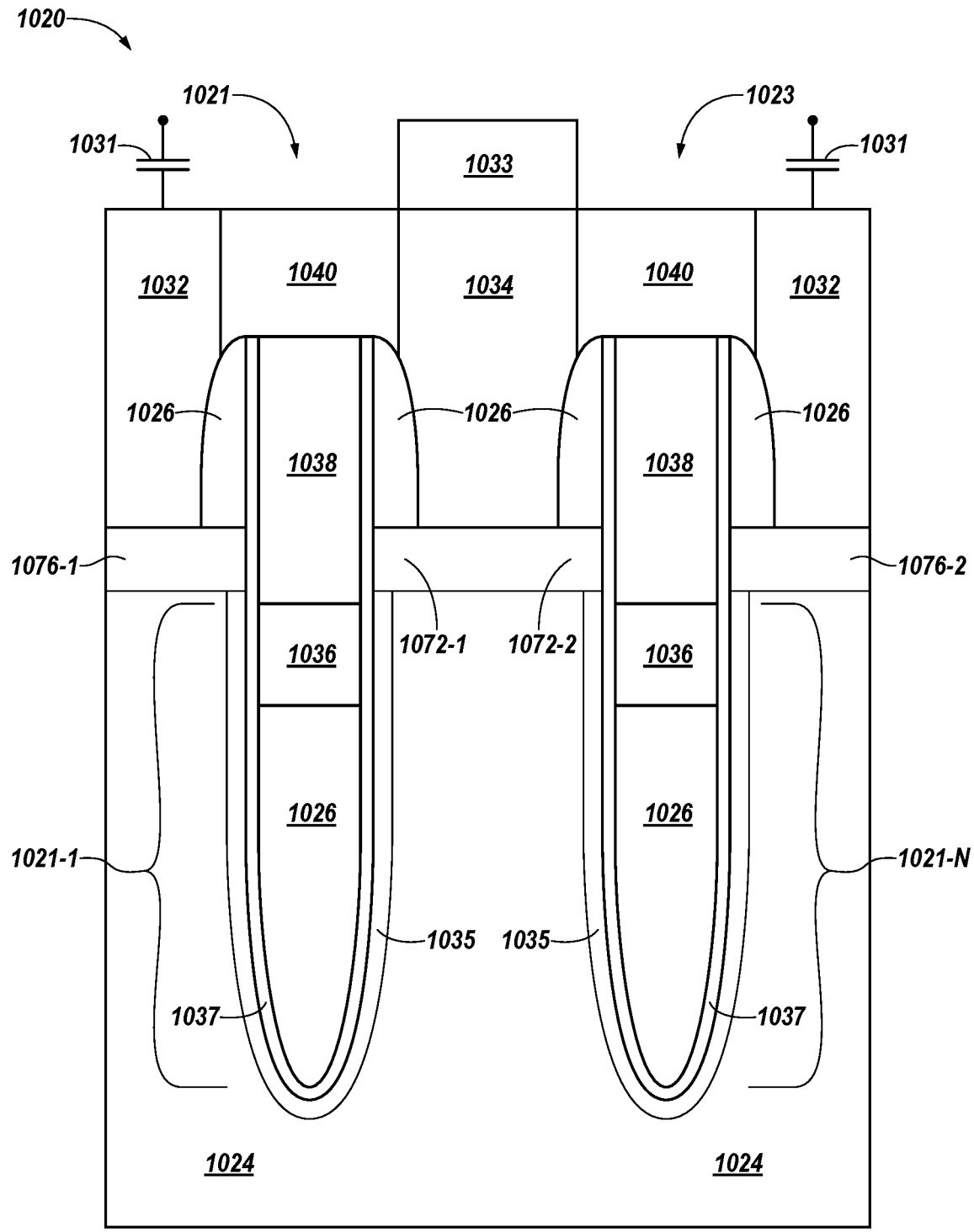
FIG. 10 illustrates a cross-sectional view of an access device which can be coupled to a storage node having an electrode in accordance with a number of embodiments of the present disclosure.

FIG. 10 illustrates a cross-sectional view of transistors in accordance with a number of embodiments of the present disclosure. FIG. 10 illustrates a gate 1021-1, . . . , 1021-N (individually or collectively referred to as gate 1021) during a fabrication process. The gate 1021 can also be referred to as a gate electrode. The gate 1021 may be a gate to a recessed access device, e.g., a buried recessed access device (BRAD). In the example shown, the gate 1021 may include a first portion 1026 including a metal, e.g., titanium nitride (TiN), and a second portion 1036 including a doped polysilicon to form a hybrid metal gate (HMG) 1021. The gate 1021 may be separated from a channel 1035, separating a first source/drain region 1076-1 and 1076-2 (collectively referred to as first source/drain region 1076) and a second source/drain region 1072-1 and 1072-2 (collectively referred to as second source/drain region 1072) by a gate dielectric 1037. In the example of FIG. 1, two neighboring access devices 1021 and 1023 are shown sharing a second source/drain region 1072 at a junction.

In the example of FIG. 10, a storage node 1031 may be coupled to the second source/drain region 1072. An insulation material 1040 (e.g., a dielectric material) can be formed on the spacer material 1026 and the gate mask material 1038, and in contact with the metallic material 1034. In at least one embodiment, a first portion 1028 of the metallic material 1034 can be formed in contact with the spacer material 1026, the source/drain regions 1072 and 1076, and the junction. The insulation material 1040 can be formed on the spacer material 1026 and the gate mask material 1038, and in contact with the metallic material 1034.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to patterning a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to patterning a semiconductor structure than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method, comprising:
   patterning a silicon hard mask material on a semiconductor structure having:
      a first silicate material on a working surface;
      a first nitride material on the first silicate material;
      a second silicate material on the first nitride material; and
      a second nitride material on the second silicate material;
   forming an opening through the semiconductor structure using the patterned hard mask to form a support pillar;
   forming a silicon liner material on the semiconductor structure;
   depositing a bottom electrode on the patterned hard mask material before performing a wet etch process; and
   removing the silicon liner material using the wet etch process.

2. The method of claim 1, further comprising depositing a bottom electrode on the silicon hard mask material wherein the bottom electrode comprises depositing a titanium nitride (TiN) material.

3. The method of claim 1, wherein forming the silicon hard mask material comprises forming a polysilicon material.

4. The method of claim 1, further comprising forming the silicon liner material on the second nitride material after removing the silicon hard mask material.

5. The method of claim 1, further comprising patterning the combination of the first silicate material, the first nitride material, the second silicate material, and the second nitride material to a height of greater than 10,000 Angstroms.

6. The method of claim 1, further comprising forming a silicon hard mask material to a height of a range between 500 Angstroms to 5,000 Angstroms.

7. A method, comprising:
   patterning a semiconductor structure having:
      a first silicate material on a working surface;
      a first nitride material on the first silicate material;
      a second silicate on the first nitride material; and
      a second nitride material on the second silicate material;
   forming a silicon hard mask material on top of the second silicate material;
   depositing a bottom electrode on the silicon hard mask material before performing a wet etch; and
   removing a portion of the silicon hard mask material after depositing the bottom electrode.

8. The method of claim 7, further comprising removing approximately 60% of a height of the silicon hard mask material using the wet etch process.

9. The method of claim 7, further comprising patterning the first silicate material to a height between 2,000 Angstroms and 6,000 Angstroms.

10. The method of claim 7, further comprising removing a portion of the silicon hard mask material to a height between 50 Angstroms and 400 Angstroms.

11. The method of claim 7, further comprising patterning the second silicate material to a height between 2,500 Angstroms and 4,500 Angstroms.

12. The method of claim 7, further comprising patterning the first nitride material to a height between 50 Angstroms and 600 Angstroms.

13. A method, comprising:
   patterning a semiconductor structure having:
      a borophosphosilicate glass (BPSG) material on a working surface;
      a first nitride material on the BPSG material;
      a tetraethyl orthosilicate (TEOS) material on the first nitride material; and
      a second nitride material on TEOS material;
   forming a silicon hard mask material on top of the second silicate material;
   removing a portion of the silicon hard mask material using a wet etch process, and gaining a capacitance between 0.1 to 2% femto Farads by retaining a remaining portion of the silicon hard mask material.

14. The method of claim 13, further comprising patterning a silicon liner material above the remaining portion of the silicon hard mask material to a height of a range between 50 Angstroms to 500 Angstroms.

15. The method of claim 13, further comprising patterning the second nitride material to a height between 200 and 1,000 Angstroms.

16. The method of claim 13, further comprising protecting the second nitride material using a ⅓ layer of the silicon hard mask material.

17. The method of claim 13, wherein removing the remaining portion the silicon hard mask material causes a silicon liner material to recess below the second nitride material.

18. The method of claim 17, wherein removing the portion of the silicon hard mask material causes the silicon liner material to recess between 2 nm and 20 nm within the semiconductor structure.

19. The method of claim 17, wherein removing the remaining portion of the silicon hard mask material in the wet etch process improves the silicon liner material recess by a range of 10% to 20% over a dry etch process.

20. The method of claim 13, further comprising performing the wet etch process using Ammonia.

21. The method of claim 13, further comprising patterning the first and the second nitride materials to include one of a silicon doped titanium nitride (TiSiN) and a titanium nitride (TiN).

* * * * *